(12) United States Patent
Huang et al.

(10) Patent No.: US 8,766,403 B2
(45) Date of Patent: Jul. 1, 2014

(54) CAPACITOR ARRAYS FOR MINIMIZING GRADIENT EFFECTS AND METHODS OF FORMING THE SAME

(75) Inventors: Chi-Feng Huang, Zhubei (TW); Chia-Chung Chen, Keelung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 16 days.

(21) Appl. No.: 13/366,750

(22) Filed: Feb. 6, 2012

(65) Prior Publication Data

US 2013/0200489 A1 Aug. 8, 2013

(51) Int. Cl.
 *H01L 29/92* (2006.01)
(52) U.S. Cl.
 USPC ........... 257/532; 257/296; 257/312; 257/526; 257/E21.008; 257/E27.03; 257/E27.071; 257/E29.342; 365/148; 716/115; 341/172; 341/155; 438/381
(58) Field of Classification Search
 CPC .. H01L 23/5223; H01L 27/0629; H01L 28/88
 USPC ........... 257/532, 296, 312; 341/172; 716/115
 See application file for complete search history.

(56) References Cited

U.S. PATENT DOCUMENTS

| | | | |
|---|---|---|---|
| 5,973,633 A * | 10/1999 | Hester | 341/172 |
| 2005/0077581 A1 | 4/2005 | Chang et al. | |
| 2008/0099879 A1 | 5/2008 | Chen et al. | |
| 2011/0309420 A1* | 12/2011 | Chang et al. | 257/312 |

FOREIGN PATENT DOCUMENTS

TW 200535880 11/2005

OTHER PUBLICATIONS

Chen, D. C., et al., "A Novel RF-WAT Test Structure for Advanced Process Monitoring in SOC Applications", 2007 IEEE International Conference on Microelectronic Test Structures, Mar. 2007, Tokyo, Japan, pp. 243-247.
Chiu, C.S., et al, "A Novel Process-Controlled-Monitor Structure Suitable for RF CMOS Characterization", 2005 IEEE MTT-S International Microwave Symposium Digest, Jun. 2005, pp. 1299-1302.
Zhang, Y., et al., "Interconnect Capacitance Characterzation based on Charge Based Capacitance Measurement (CBCM) Technique for DFM Applications", 9th International Conference on Solid-State and Integrated-Circuit Technology, Oct. 2008, ICSICT 2008, pp. 2280-2283.
Chen, J.C., et al., "An On-Chip, Attofarad Interconnect Charge-Based Capacitance Measurement (CBCM) Technique", International Electron Devices Meeting, Dec. 1996, IEDM '96, pp. 69-72.

(Continued)

*Primary Examiner* — Jerome Jackson, Jr.
*Assistant Examiner* — Bo Fan
(74) *Attorney, Agent, or Firm* — Duane Morris LLP

(57) ABSTRACT

Semiconductor devices having capacitor arrays and methods of forming the same. A semiconductor device is formed including a capacitor array. The capacitor array includes a plurality of operational capacitors formed along a diagonal of the capacitor array. The capacitor array also includes a plurality of dummy capacitors formed substantially symmetrically about the plurality of operational capacitors in the capacitor array. A first operational capacitor is formed at a first edge of the capacitor array. Each one of the plurality of operational capacitors is electrically coupled to a non-adjacent other one of the plurality of operational capacitors.

20 Claims, 12 Drawing Sheets

(56) References Cited

OTHER PUBLICATIONS

Doong, K.Y.Y., et al., "4K-cells Resistive and Charge-Base-Capacitive Measurement Test Structure Array (RCBCM-TSA) for CMOS Logic Process Development, Monitor and Model", IEEE International Conference on Microelectronic Test Structures, Mar. 2009, ICMTS 2009, pp. 216-220.

* cited by examiner

CAPACITOR ARRAYS FOR MINIMIZING GRADIENT EFFECTS AND METHODS OF FORMING THE SAME

FIELD OF THE INVENTION

The present disclosure is directed generally to semiconductor devices and manufacturing processes for the same and more particularly to semiconductor devices having capacitor arrays.

DESCRIPTION OF THE RELATED ART

In integrated circuit (IC) design, many applications exist for high-performance, on-chip capacitors. These applications include dynamic random access memories, voltage controlled oscillators, phase-locked loops, operational amplifiers, and switching capacitors. Such on-chip capacitors can also be used to decouple digital and analog integrated circuits from the noise of the rest of the electrical system.

The development of capacitor structures for integrated circuits has evolved from the initial parallel plate capacitor structures comprised of two conductive layers, to trench capacitor designs, Metal-Oxide-Metal (MOM) capacitor designs and more recently to interdigitated finger MOM capacitor structures. Interdigitated finger MOM capacitor structures (also referred to as comb-capacitors or fork-capacitors) exploit the lateral electric fields between the electrodes in the same layer, thereby creating higher capacitance values per unit area than previous capacitor designs. To achieve higher capacitance, capacitors may be stacked vertically and interconnected in parallel by one or more vias between the electrode layers. Additionally, capacitors may be formed into capacitor arrays on a single layer or on a plurality of layers to increase packing density and lateral capacitance for incorporation into a library of circuit design tools.

Conventional array-type MOM capacitor designs suffer chemical-mechanical polishing (CMP) issues such as dishing and erosion, and also problems with capacitance mismatch across the capacitor array, that further degrade with array size. Shifts in capacitance from array edge to array center of are also suffered in these conventional array-type MOM capacitor designs. Mismatch degradation, inaccuracies in MOM capacitance across the array, and yield loss due to MOM capacitance shift across the array result in degraded device performance and reliability.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

Figure 1A:
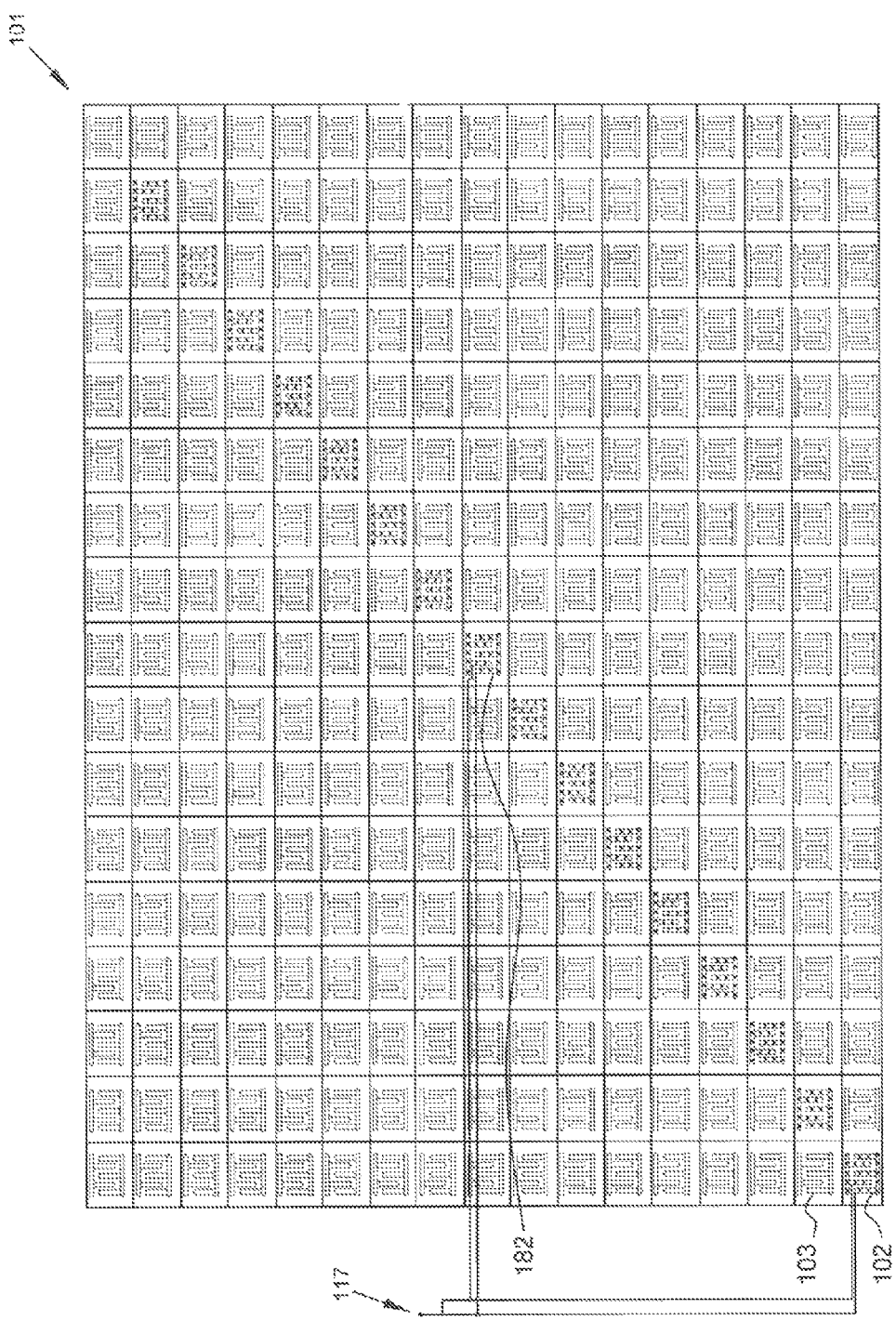
FIG. 1A illustrates a plan view of a semiconductor device including a capacitor array according to some embodiments of the present disclosure.

With reference to the Figures, where like elements have been given like numerical designations to facilitate an understanding of the drawings, the various embodiments of a multigate semiconductor device and methods of forming the same are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and may even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

An improved semiconductor device is described below, with improved capacitor array design. The semiconductor device fabrication processes described herein may be performed using any suitable commercially available equipment commonly used in the art to manufacture semiconductor devices having capacitor arrays, or alternatively, using future developed equipment.

Forming capacitor arrays in IC design has been observed to increase lateral capacitance and packing density and improve device performance. However, gradient effects across the capacitor array, e.g. mismatch degradation with increasing array size, and shifts in capacitance from capacitor array edge to center (e.g. 1.4%) have been observed during CMP processes. The observed capacitance shift is further degraded for capacitors formed at an array edge (e.g. 3.4%). The inventors have determined that this capacitor array gradient effect and capacitance shift across the array can be minimized through an enhanced array design that further avoids CMP process issues such as dishing and erosion, and has improved model accuracy. Additionally, the inventors have determined that these benefits can be achieved without modifications to existing design rules (e.g. DRC). In some embodiments, improvements in device performance and reliability can be achieved through formation of MOM capacitors and dummy patterns in an enhanced checkerboard array design.

With reference now to FIG. 1A, a plan view of a semiconductor device including a capacitor array according to some embodiments of the present disclosure is provided. As illustrated, the semiconductor device 100 includes a capacitor array 101. The capacitor array includes a plurality of operational capacitors 102 formed along a diagonal of the capacitor array 101. In some embodiments, each one of the plurality of operational capacitors 102 is a "metal-oxide-metal" (MOM) capacitor. Any suitable conductive material may be used in the formation of the electrodes of a capacitor. Each electrode may be comprised of the same or different conductive materials such as copper, aluminum, titanium nitride clad titanium, doped poly silicon, or another conductive material system. For simplicity, regardless of what specific type of metal is used, such a capacitor is referred to as a MOM capacitor henceforth. As used herein, the term "metal-oxide-metal capacitor" is not limited to configurations in which the capacitor dielectric is a silicon oxide, and broadly encompasses the use of other dielectric materials for the MOM capacitor dielectric, as such materials are integrated into semiconductor fabrication in various present and future technology nodes, such as, but not limited to, low-k dielectrics and extreme low-k dielectrics. In one embodiment, each one of the plurality of operational capacitors is a finger MOM capacitor.

In some embodiments, each one of the plurality of operational capacitors 102 is formed adjacent to at least one other one of the plurality of operational capacitors 102. In one embodiment, a first operational capacitor 102 is formed at a first edge of the capacitor array 101. As shown, a first operational capacitor 102 is formed at the bottom left edge of the capacitor array 101.

The capacitor array 101 also includes a plurality of dummy capacitors 103. Dummy patterns such as capacitors 103 may be provided for process-related reasons. In some embodiments, dummy patterns are included to increase metal density, so that dishing and erosion are avoided in subsequently deposited interconnect layers. Dummy capacitors 103 may have a similar, or even identical structure, to that of operational capacitors 102. However, dummy capacitors 103 are unconnected to any of the operational circuits in the semiconductor device 100, and thus do not perform an operational function during operations of the semiconductor device 100. For example, dummy capacitors 103 do not have electrical functions, and are not electrically coupled to any of the operational capacitors 102 in the capacitor array 101. As illustrated in FIG. 1A, the plurality of dummy capacitors 103 are formed substantially symmetrically about the plurality of operational capacitors 102 in the capacitor array 101. The substantial symmetry refers to the approximate visual symmetry achieved by forming the checkerboard pattern arrangement. The checkerboard pattern arrangement may be a substantially equilateral N×N two dimensional grid where either a dummy capacitor or an operational capacitor is formed in each cell of the N cells of the grid with an approximately equivalent size of the capacitors (N cells) and an approximately equivalent spacing between the capacitors (N cells) selected. In some embodiments, the checkerboard pattern arrangement may be rectangular in shape. However, any suitable shape may be utilized for the checkerboard pattern arrangement (e.g. parallelogram, regular polygon, etc.) In some embodiments, the sides parallel to one another, if any, are approximately equivalent in length, that the angles at the vertices of the shape are approximately equiangular. In some embodiments, a plurality of operational capacitors are formed along a diagonal of the checkerboard pattern arrangement and a plurality of dummy capacitors 103 are formed about the plurality of operational capacitors 102 to fill in the two dimensional grid to achieve approximate visual symmetry.

For example, in the illustrated embodiment, showing a 17×17 matrix of operational capacitors 102 and dummy capacitors 103, there are sixteen (16) operational capacitors 102 formed along a diagonal of the array 101. As described above, a first operational capacitor 102 is formed at a first edge (lower left edge) of the capacitor array 101. As illustrated, a dummy capacitor 103 is formed at an opposite edge (upper right edge) of the capacitor array 101. Two hundred forty (240) dummy capacitors 103 are formed about the 16 operational capacitors 102 with one hundred twenty (120) dummy capacitors 103 formed along one side of the operational capacitor diagonal and one hundred twenty (120) dummy capacitors 103 formed along the opposing side of the operational capacitor diagonal to achieve a symmetric (about the diagonal) 16×16 bi-equilateral shaped array 101. Additionally, there is an additional seventeen (17) dummy capacitors formed in a top row of the matrix and an additional sixteen (16) dummy capacitors formed in a side row of the matrix such that one dummy capacitor is formed at an upper right edge of the capacitor array 101 and to achieve a substantially symmetric 17×17 equilateral shaped array 101.

The number of dummy capacitors 103 formed in the array 101 depends on the size of the array, the size selected for the individual capacitors and the number of operational capacitors formed along a diagonal of the array. For example, in the embodiment shown in FIG. 1A, if each side of the capacitor array was 80 μm, each of the N cells may be about, for example, 4.7 μm in length and/or width such that each capacitor may be between, for example, about 1 and 4 μm in length and/or width, although different dimensions can also be used. Further by way of example, the spacing between the capacitors may be between, for example, about 0.7 and 3.7 μm in length and/or width, although different dimensions can also be used. Accordingly, the capacitor density may be determined based on design needs. In the embodiment shown in FIG. 1A, there are a total of 289 capacitors formed in the capacitor array 101. In some embodiments, at least two of the plurality of dummy capacitors 103 are formed adjacent to each one of the plurality of operational capacitors.

Figure 1B:
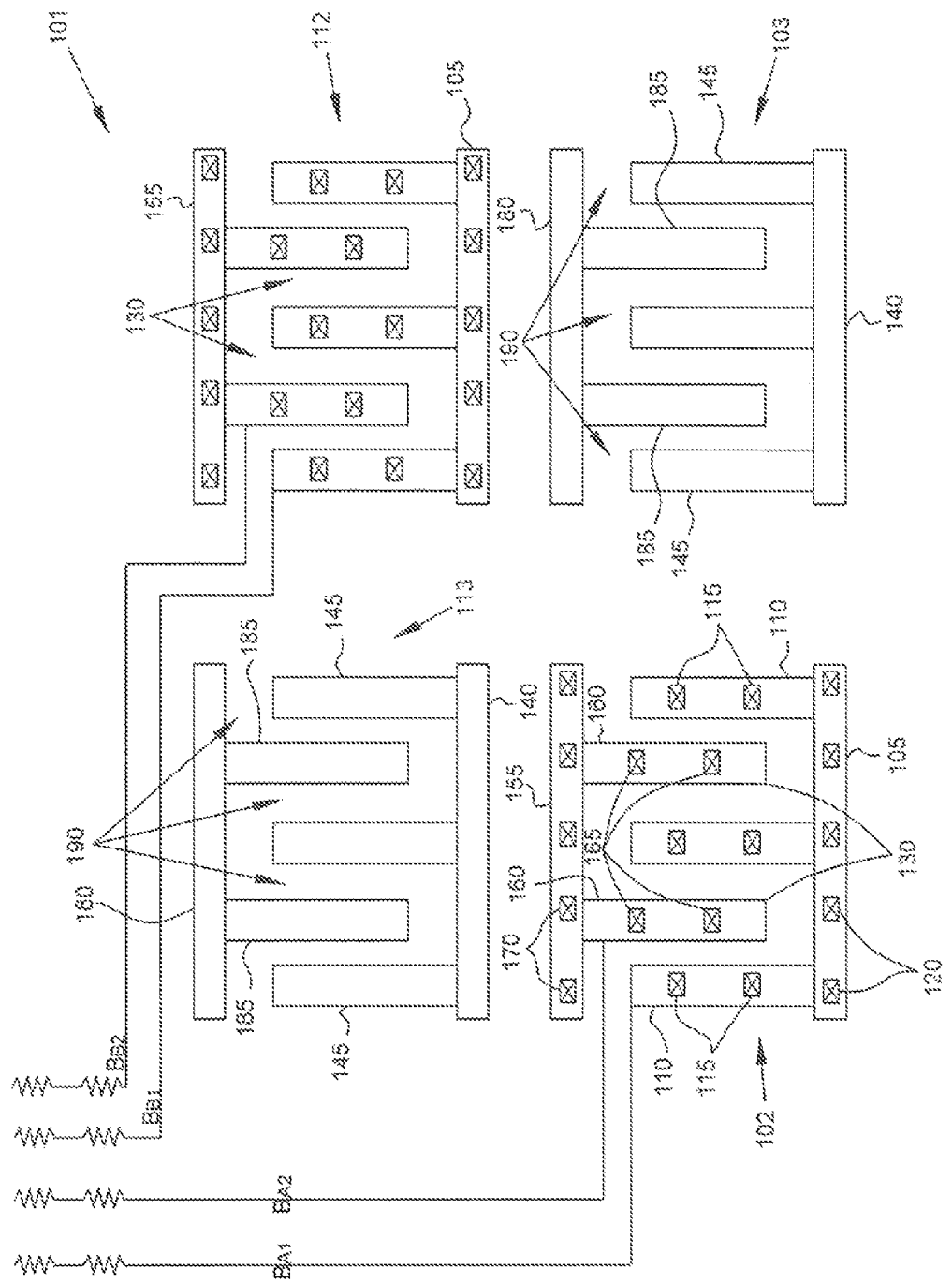
FIG. 1B illustrates an enlarged schematic plan view of the semiconductor device including a portion of the capacitor array of FIG. 1A.

Referring now to FIG. 1B, an enlarged schematic plan view of a semiconductor device 100 including a portion of an example capacitor array 101 of FIG. 1A is provided. As shown, operational capacitors 102 and dummy capacitors 103 are finger MOM capacitors. Operational capacitors 102 include a first electrode 105 formed by a frame portion and a second electrode 155 formed by another frame portion. Operational capacitors 102 also include a plurality of fingers 110 (160), wherein neighboring fingers 110 (160) are closely located and separated from each other by inter-metal dielectric material. Neighboring fingers 110, 160 form sub-capacitors. The fingers 110 of the first electrode 105 are interleaved between and are parallel to respective fingers 160 of the other electrode 155, It is understood that although the electrodes and fingers are described as separate patterns for illustration purposes, that the fingers and electrodes can be formed as a single pattern. The electrodes 105 (155) and fingers 110 (160) may be formed from a metal such as copper, tungsten or aluminum using a single damascene process or an alloy, such as but not limited to, titanium nitride, tantalum nitride, or aluminum nitride. In other embodiments which do not use a high-k metal gate process, the electrodes 105 (155) and fingers 110 (160) may be polycrystalline silicon. Alternatively, the electrodes 105 (155) and fingers 110 (160) may be formed by depositing and patterning a metal layer and the underlying via layer in a dual-damascene process.

A dielectric material layer 120 is shown is provided between the electrodes 105 (155) and between the fingers 110 (160) and may comprise a material such as a silicon oxide, a silicon nitride, silicon oxy-nitride, low-k dielectric, or ELK material. In some embodiments, the dielectric material layer 120 may comprise a high-K dielectric 120, such as, but not limited to, a hafnium based oxide, a hafnium based oxynitride, or a hafnium-silicon oxynitride, hafnium silicate, zirconium silicate, hafnium dioxide and zirconium dioxide. The high-k dielectric layer 120 may include a binary or ternary high-k film such as HfO, LaO, AlO, ZrO, TiO, $Ta_2O_5$, $Y_2O_3$, STO, BTO, BaZrO, HfZrO, HfLaO, HfTaO, HfTiO, combinations thereof, or other suitable materials. Alternatively, the high-k dielectric layer 120 may optionally include a silicate such as HfSiO, LaSiO, AlSiO, combinations thereof. The dielectric material layer 120 may be deposited using atomic layer deposition. In other embodiments, which do not use a high-k metal gate process, the structure and technique described herein may be used in a process employing a silicon oxide gate insulating layer.

In order to achieve higher capacitance, operational capacitors 102 may be stacked in a substantially vertical fashion in a plurality of layers interconnected in parallel with one or a plurality of vias 120 (170), 115 (165) between the electrode layers and between the finger layers. Any suitable interconnect scheme may be used. For example, via locations 120 (170), 115 (165) may be interconnected to via locations in another layer through an intervening layer of dielectric 120 separating the plurality of stacked layers. Thus, the capacitor array 101 may be further arrayed in three dimensions yielding a modular capacitor array design suitable for incorporation into a library of circuit design standard cells.

As illustrated in FIG. 1B, in some embodiments, dummy capacitors 103 (113) may be formed as finger MOM capacitors. Dummy capacitors 103 may include a first dummy electrode 140 formed by a frame piece and a second electrode 180 formed by another frame piece. Dummy capacitors 103 (113) may also include a plurality of dummy fingers 145 (185), wherein neighboring fingers 145 (185) are closely located and insulated from each other. The dummy fingers 145 of the first dummy electrode 140 are interleaved between and are parallel to respective dummy fingers 185 of the other dummy electrode 180, It is understood that although the dummy electrodes and dummy fingers are described as separate entities for illustration purposes, that the dummy fingers and dummy electrodes can be formed as a single piece. A dielectric material layer 190 is shown as provided between the dummy electrodes 140 (180) and between the dummy fingers 145 (185). As described above, dummy capacitors 103 (113) may have a similar, or even identical structure, to that of operational capacitors 102 but are unconnected to any of the operational circuits in the semiconductor device 100, and thus do not perform a logic function during operations of the semiconductor device 100. As shown in FIG. 1B, dummy capacitors 103 (113) are formed adjacent to operational capacitors 102 (112).

Figure 2A:
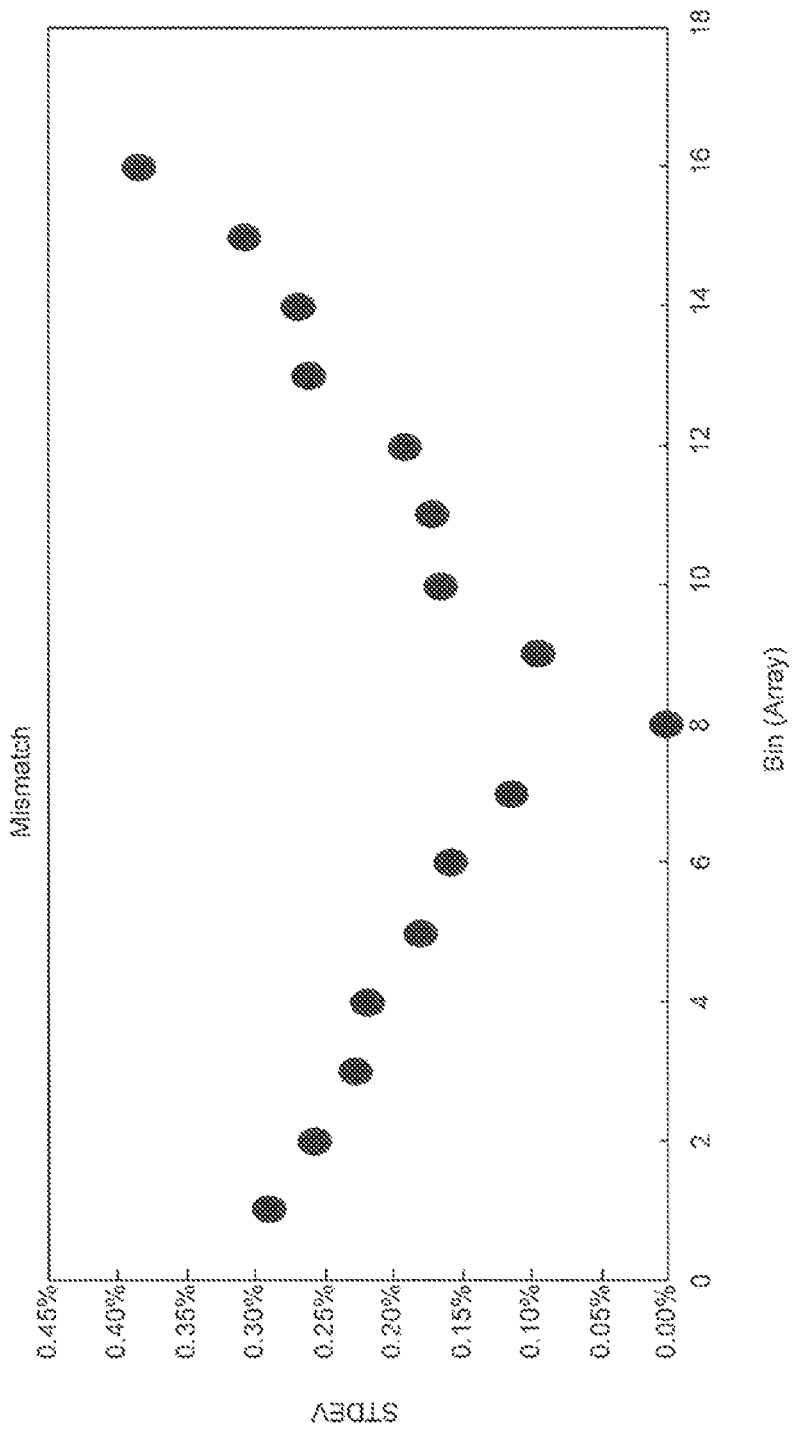
FIG. 2A is a diagram showing standard deviation of capacitance mismatch across an example of a capacitor array formed according to an embodiment of the present disclosure.

The inventors have observed that by forming a checkerboard array design using operational and dummy capacitors, MOM capacitor gradient effect can be reduced, capacitance shift across the capacitor array can be minimized, chemical-mechanical polishing (CMP) process issues such as dishing and erosion can be reduced, and improved model accuracy can be achieved. For example, FIG. 2A shows a diagram of standard deviation of capacitance mismatch across an example of a capacitor array 101 formed according to an embodiment of the present disclosure. In the illustrated embodiment, a N28 MOM capacitor array was formed. The capacitor array 101 comprised a substantially equilateral 17×17 two dimensional grid as illustrated in FIG. 1A including 16 operational capacitors formed along a diagonal of the array and 273 dummy capacitors formed substantially symmetrically about the operational capacitors 102 in the capacitor array 101. Each side of the capacitor array 101 was approximately 80 μm in length. An operational capacitor 102 was formed in the lower left edge of the capacitor array and a dummy capacitor 103 was formed in the upper left and right edge cells, and lower right edge cell, of the capacitor array 101.

FIG. 2A illustrates the standard deviation of the capacitance mismatch measured from right edge to center to left edge across an example of the capacitor array using a charge based capacitance measurement (CBCM) technique. The average capacitance of the 16 operational capacitors was 34.5 femtofarads. With reference to FIG. 1A including the cells illustrating various operational capacitors 102 in order by location, the mismatch between the right edge operational capacitor and the center and traveling across the operational capacitors 102 in the capacitor array 101 was observed between 0.30% and 0% femtofarads of standard deviation. The mismatch between the second-to-leftmost edge operational capacitor (112) and the center and traveling across the operational capacitors 102 in the capacitor array 101 was also observed between 0.30% and 0% femtofarads of standard deviation. However, the mismatch between the left edge operational capacitor (102) and the center was observed as approximately 0.40% femtofarads of standard deviation Thus, although decreased significantly, some gradient effect still exists across this example of the capacitor array (101).

Figure 2B:
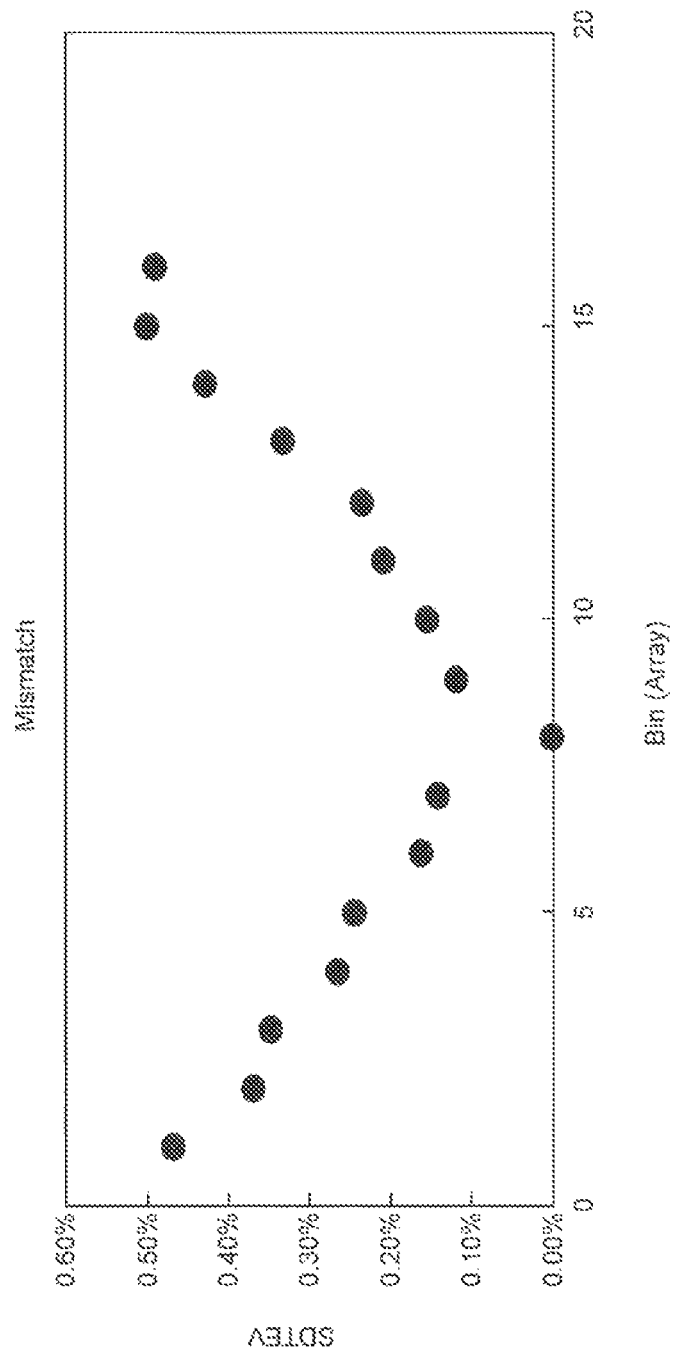
FIG. 2B is a diagram showing standard deviation of capacitance mismatch across another example of a capacitor array formed according to an embodiment of the present disclosure.

FIG. 2B illustrates the standard deviation of the capacitance mismatch measured from right edge to center to left edge across an example of the capacitor array 101 using a charge based capacitance measurement (CBCM) technique.

The average capacitance of the 16 operational capacitors 102 was 23 femtofarads. The mismatch between the right edge operational capacitor and the center and traveling across the operational capacitors 102 in the capacitor array 101 was observed between approximately 0.48% and 0% femtofarads of standard deviation. The mismatch between the left edge operational capacitor and the center and traveling across the operational capacitors in the capacitor array was also observed between approximately 0.51% and 0% femtofarads of standard deviation Thus, although decreased significantly, some gradient effect also still exists across this example of the capacitor array 101.

Figure 3:
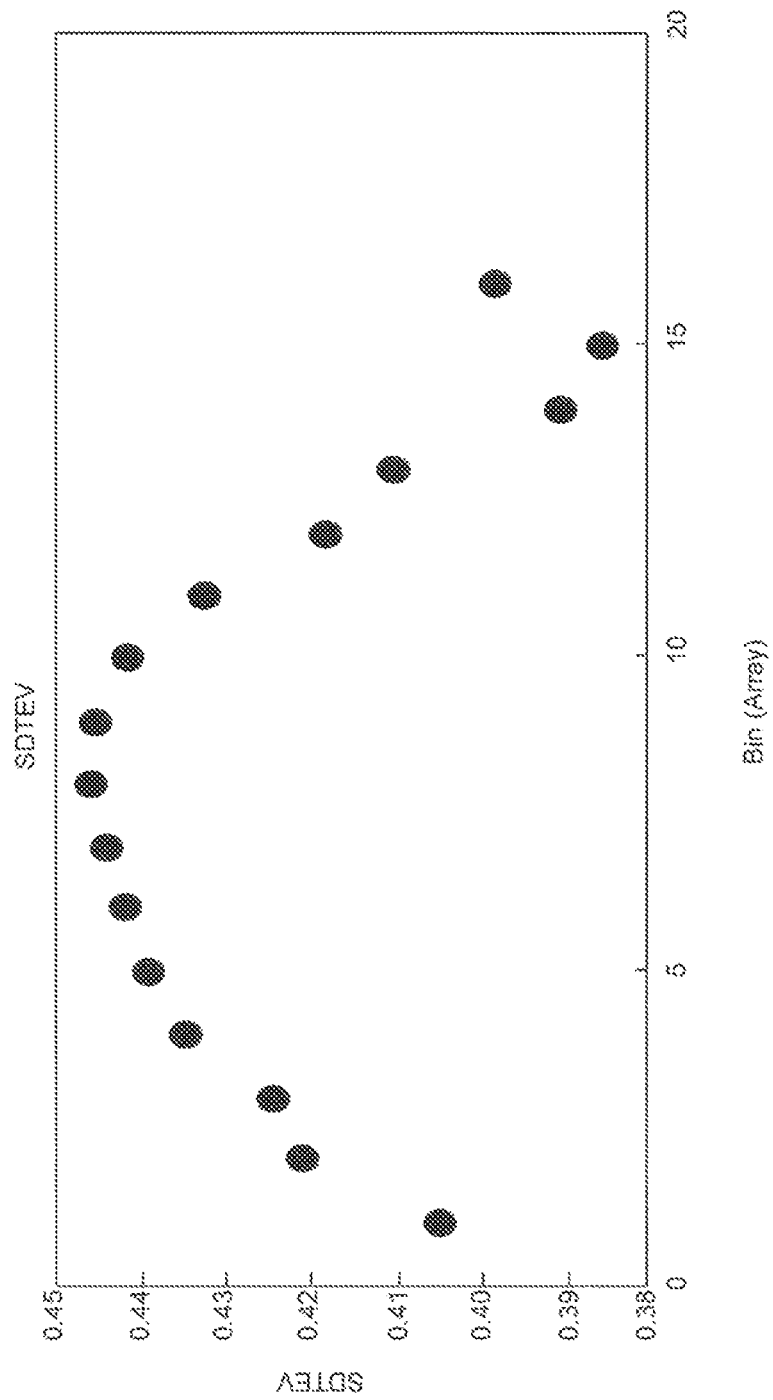
FIG. 3 is a diagram showing standard deviation of capacitance measured across an example of a capacitor array formed according to an embodiment of the present disclosure.

FIG. 3 illustrates the standard deviation of the capacitance measured from right edge to center to left edge across an example of the capacitor array using a CBCM technique. The average capacitance of the 16 operational capacitors was 23 femtofarads. The determined standard deviation varied by 1.16 femtofarads between the capacitance measured at the left edge of the capacitor array, the capacitance measured at the center of the capacitor array, and the capacitance measured at the right edge of the capacitor array. However, while the standard deviation of the second-to-leftmost edge operational capacitor (112) was observed at approximately 0.385%, the standard deviation of the leftmost edge operational capacitor (102) was observed at approximately 0.40%.

Figure 4:
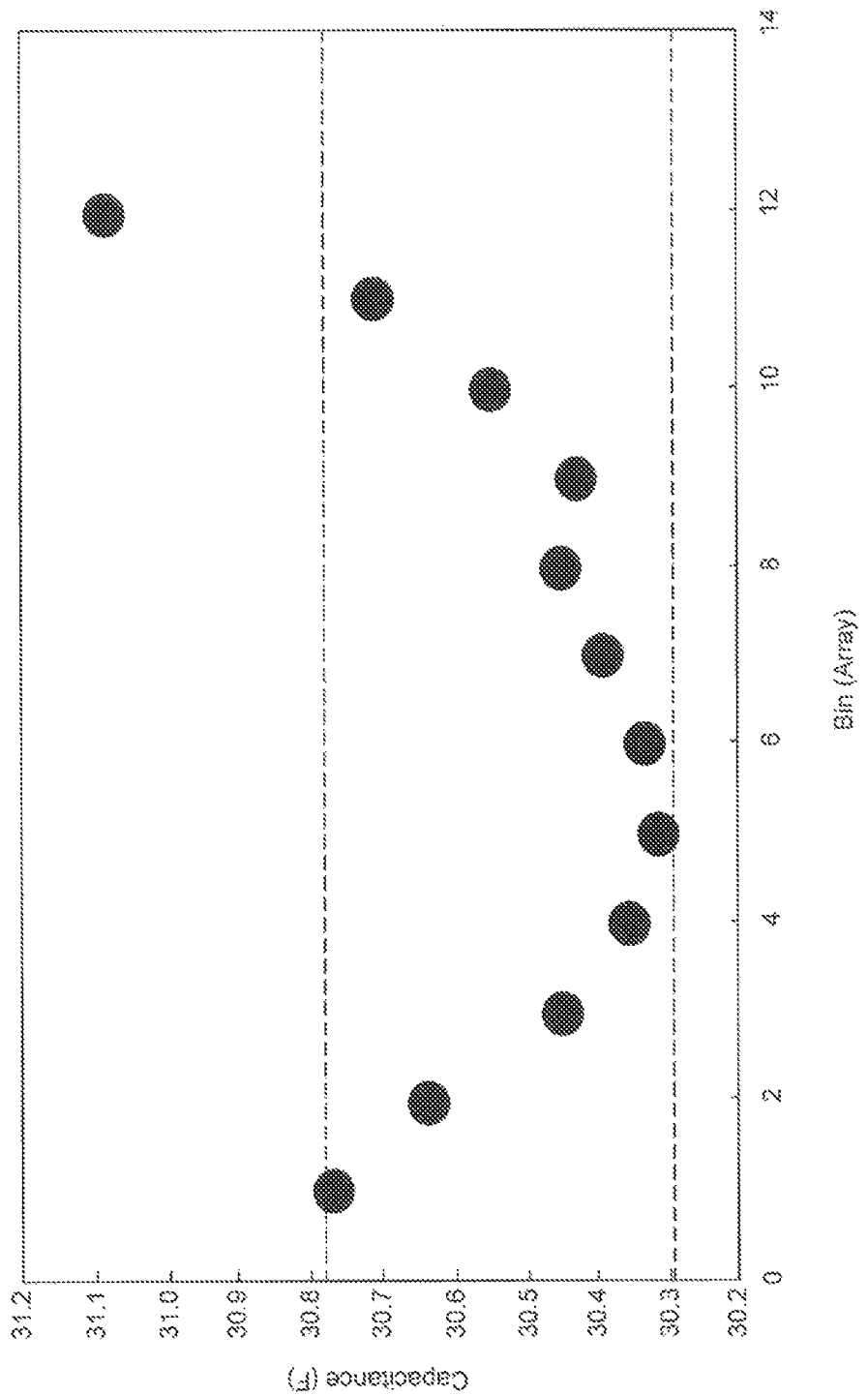
FIG. 4 is a diagram showing capacitance measured across an example of a capacitor array formed according to an embodiment of the present disclosure.

FIG. 4 illustrates the capacitance measured from right edge to center to left edge across an example of the capacitor array using a CBCM technique. As illustrated, the median capacitance of the 16 operational capacitors 102 was approximately 30.8 femtofarads. The capacitance measured across the capacitor array 101 between the right edge operational capacitor and the second-to-leftmost edge operational capacitor (122) was observed to fall at or within 1.9% below the median measured capacitance. However, the capacitance measured for the leftmost edge operational capacitor (112) was observed to fall at approximately 1.9% higher than the median measured capacitance.

Figure 5:
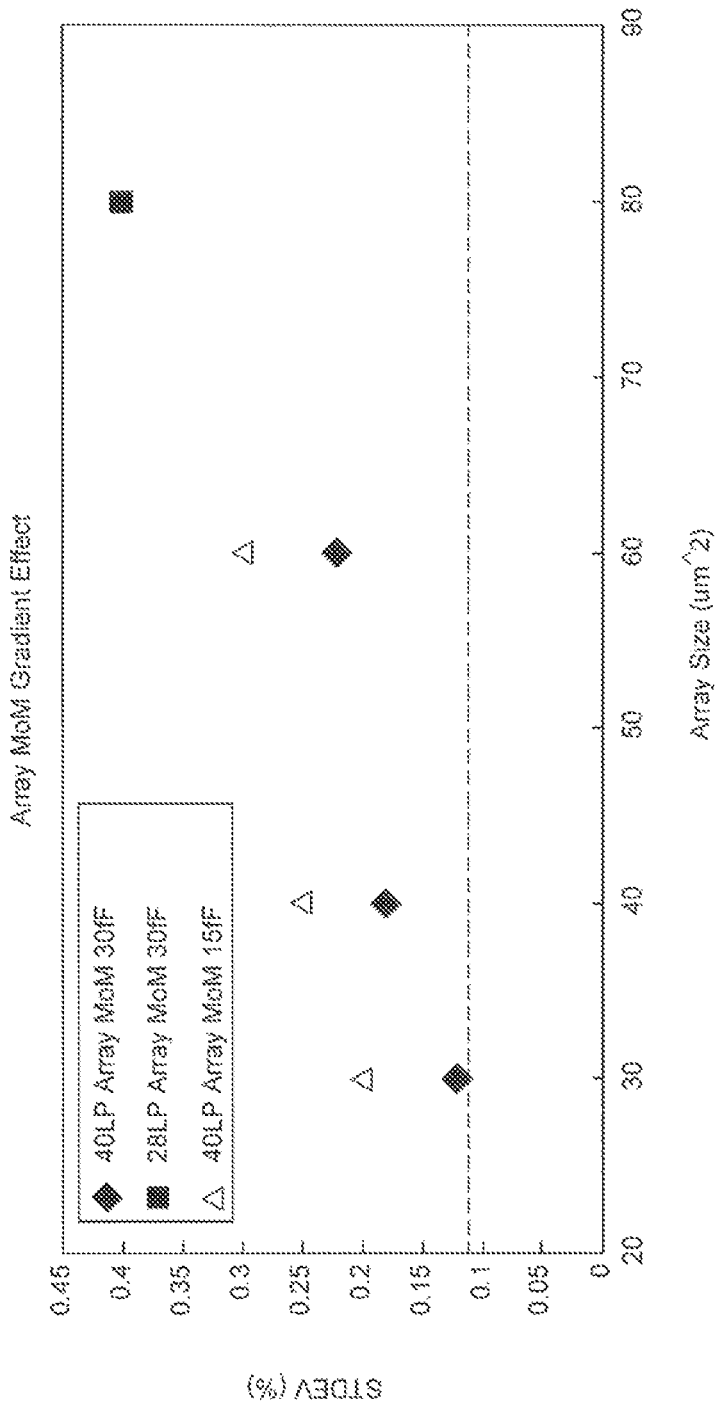
FIG. 5 is a diagram showing mean standard deviation of capacitance across examples of capacitor arrays formed according to embodiments of the present disclosure as a function of capacitor array size.

FIG. 5 shows the standard deviation of total capacitance across examples of capacitor arrays measured using a CBCM technique as a function of capacitor array size. As illustrated, the inventors observed that as capacitor array size increases, the capacitance mismatch and gradient effect worsens. The inventors also observed that for smaller arrays, since the capacitor area is smaller, and the poly density is lower, the CMP process effects, such as dishing and erosion, increase, The inventors have determined that the observed gradient effect, capacitance mismatch and capacitance shift across the capacitor array, in the array design of FIGS. 1A and 1B, may be improved for electrically coupling non-adjacent operational capacitors to each other. Referring back to FIGS. 1A and 1B, in some embodiments, each one of the plurality of operational capacitors 102 is electrically coupled to a non-adjacent other one of the plurality of operational capacitors 102. For example, operational capacitor 102 is electrically coupled to a non-adjacent other one of the plurality of operational capacitors (182) via buses $B_{A/1}$, $B_{A/2}$ connecting the respective fingers 110, 160 of the interconnected operational capacitors 102, 182. The electrically coupled operational capacitors 102, 182 are further interconnected to a common node 117. In some embodiments, the buses $B_{A1}$, $B_{A2}$ ($B_{B1}$, $B_{B2}$) are metal lines formed in a metallization layer using a damascene process. Alternatively, the buses $B_{A1}$, $B_{A2}$ ($B_{B1}$, $B_{B2}$) may be formed by depositing and patterning a metal layer. For example, and with reference to FIGS. 1A and 1B, a first operational capacitor 102 formed in a first edge of the capacitor array 101 may be electrically coupled to a second non-adjacent operational capacitor 182 formed, for example, in the center of the capacitor array 101 via buses $B_{A1}$, $B_{A2}$. The inventors have therefore determined that electrically coupling non-adjacent operational capacitors further improves the array design described above in connection with FIGS. 1A and 1B, Referring now to FIG. 6A, a plan view of a semiconductor device including a capacitor array according to some embodiments of the present disclosure is provided. As illustrated, the semiconductor device 600 includes a capacitor array 601. The capacitor array includes a plurality of operational capacitors 602 formed along a diagonal of the capacitor array 101. In some embodiments, each one of the plurality of operational capacitors 602 is a MOM capacitor. Any suitable conductive material may be used in the formation of the electrodes of a capacitor as described above. In one embodiment, each one of the plurality of operational capacitors is a finger MOM capacitor. In some embodiments, each one of the plurality of operational capacitors 602 is formed adjacent to at least one other one of the plurality of operational capacitors 602. In one embodiment, a first operational capacitor 602 is formed at a first edge of the capacitor array 601. As shown, a first operational capacitor 602 is formed at the bottom left edge of the capacitor array 601.

The capacitor array 601 also includes a plurality of dummy patterns 606. Dummy patterns 606 may not have any electrical functions and may not be electrically coupled to any of the operational capacitors 602, or any other active circuits (not shown) in the semiconductor device 600. Dummy patterns 606 are formed according to any suitable deposition or patterning method. The dummy patterns 606 preferably comprise in plan view a square shape or rectangle shape although other shapes are suitable. For example, dummy patterns 606 may comprise in plan view a parallelogram shape, a regular polygon shape, or a plurality of smaller shapes (e.g. squares) that collectively form a dummy pattern 606. In various embodiments, dummy patterns 606 comprise dummy metal patterns 604. In other embodiments, dummy patterns 606 comprise dummy capacitor cells. In other embodiments, dummy patterns 606 comprise dummy polysilicon patterns. In some embodiments, dummy patterns 606 comprise a combination of dummy metal patterns 604 and dummy polysilicon patterns. In other embodiments, dummy patterns 606 comprise a combination of dummy metal patterns 604 and dummy capacitor cells.

Figure 6A:
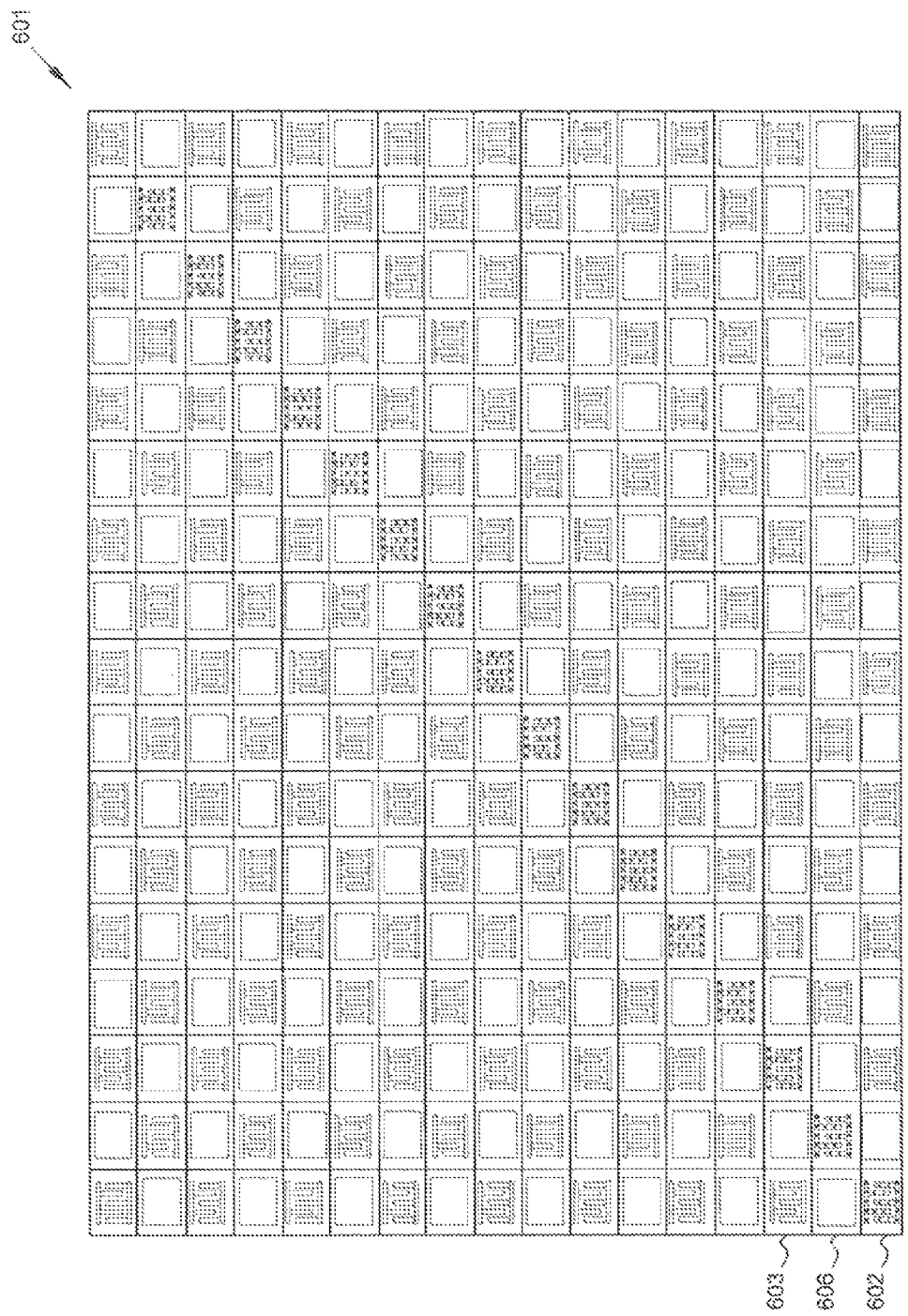
FIG. 6A illustrates a plan view of a semiconductor device including a capacitor array according to some embodiments of the present disclosure.

As illustrated in FIG. 6A, the dummy patterns 606 are intermixed with a plurality of dummy capacitors 603 about the operational capacitor 602 diagonal. As described above, dummy capacitors 603 may have a similar, or even identical structure, to that of operational capacitors 602. However, dummy capacitors 603 are unconnected to any of the operational circuits in the semiconductor device 601, and thus do not perform a function during operations of the semiconductor device 601. As shown in FIG. 6A, the plurality of dummy patterns 606 and the plurality of dummy capacitors 603 are formed substantially symmetrically about the plurality of operational capacitors 602 in the capacitor array 601. The checkerboard pattern arrangement may be a substantially equilateral N×N two dimensional grid where one of a dummy pattern 606, a dummy capacitor 603, or an operational capacitor 602 is formed in each cell of the N cells of the grid with an approximately equivalent size of the capacitors and/or patterns (N cells) and an approximately equivalent spacing between the capacitors and/or patterns (N cells) selected. In some embodiments, the checkerboard pattern arrangement may be rectangular in shape. However, any suitable shape may be utilized for the checkerboard pattern arrangement as described above.

For example, in the illustrated embodiment, showing a 16×16 matrix of operational capacitors 602, dummy capacitors 603 and dummy patterns 606, there are fifteen (15) operational capacitors 602 formed along a diagonal of the array 601. As described above, a first operational capacitor 602 is formed at a first edge (lower left edge) of the capacitor array 601. As illustrated, a dummy capacitor 603 is formed at an opposite edge (upper right edge) of the capacitor array 601. In some embodiments, a dummy pattern 606 may be formed at the opposite edge (upper right edge) of the capacitor array 601. Dummy patterns 606 are illustrated as formed in the upper left edge and lower right edge of the capacitor array 601. Ninety-eight (98) dummy capacitors 603 and one hundred twelve (112) dummy patterns 606 are formed about the 15 operational capacitors 602 with forty-nine (49) dummy capacitors 603 and fifty-six (56) dummy patterns 606 formed along one side of the operational capacitor diagonal and forty-nine (49) dummy capacitors 603 and fifty-six (56) formed along the opposing side of the operational capacitor diagonal to achieve a symmetric (about the diagonal) 15×15 bi-equilateral shaped array 601. There are an additional eight (8) dummy capacitors and an additional eight (8) dummy patterns 606 formed in a top row of the matrix. Additionally, there are an additional seven (7) dummy capacitors and an additional eight (8) dummy patterns 606 formed in a side row of the matrix such that one dummy capacitor is formed at an upper right edge of the capacitor array 101 and to achieve a substantially symmetric 16×16 equilateral shaped array 101.

The number of dummy capacitors 603 and dummy patterns 606 formed in the array 101 depends on the size of the array, the size selected for the individual capacitors and individual patterns and the number of operational capacitors formed along a diagonal of the array. For example, in the embodiment shown in FIG. 6A, if each side of the capacitor array was 80 μm, each of the N cells may be about, for example, 5 μm in length and/or width such that each capacitor and/or pattern may be between, for example, about 1 and 4 μm in length and/or width, although different dimensions can also be used. Further by way of example, the spacing between the capacitors and/or patterns may be between, for example, about 1 and 4 μm in length and/or width, although different dimensions can also be used. Accordingly, the capacitor and/or pattern density may be determined based on design needs. In the embodiment shown in FIG. 6A, there are a total of 117 capacitors, and a total of 128 dummy patterns formed in the capacitor array 101. In some embodiments, at least two of the plurality of dummy patterns 606 are formed adjacent to each one of the plurality of operational capacitors.

Figure 6B:
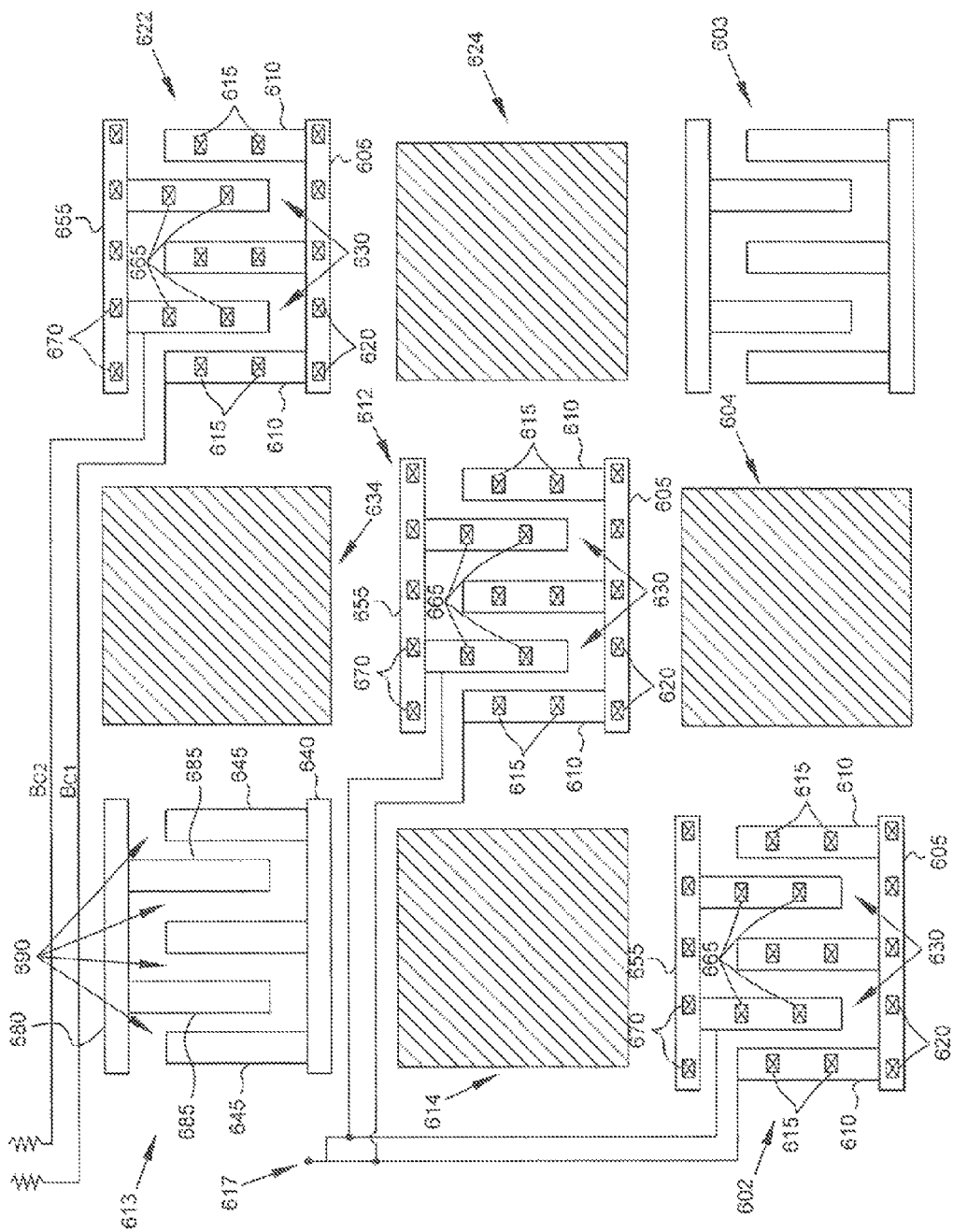
FIG. 6B illustrates an enlarged schematic plan view of a semiconductor device including a portion of an example of a capacitor array of FIG. 6A.

Referring now to FIG. 6B, an enlarged schematic plan view of a semiconductor device 600 including a portion of an example capacitor array 601 of FIG. 6A is provided. As shown, operational capacitors 602 (612, 622) and dummy capacitors 603 (613) are finger MOM capacitors. Operational capacitors 602 (612, 622) include a first electrode 605 formed by a frame portion and a second electrode 655 formed by another frame portion. Operational capacitors 602 (612, 622) also include a plurality of fingers 610 (660), wherein neighboring fingers 610 (660) are closely located and electrically insulated from each other. Neighboring fingers 610, 660 form sub-capacitors. The fingers 610 of the first electrode 605 are interleaved between and are parallel to respective fingers 660 of the other electrode 655, It is understood that although the electrodes and fingers are described as separate patterns for illustration purposes, that the fingers and electrodes can be formed as a single pattern. The electrodes 605 (655) and fingers 610 (660) may be formed from a metal or an alloy as described above, The electrodes 605 (655) and fingers 610 (660) may be formed by any suitable method.

A dielectric material layer 620 as shown is provided between the electrodes 605 (655) and between the fingers 610 (160) as described above. In order to achieve higher capacitance, operational capacitors 602 may be stacked in a substantially vertical fashion in a plurality of layers interconnected with one or a plurality of vias 620 (670), 615 (665) between the electrode layers and between the finger layers. Any suitable interconnect scheme may be used. As illustrated in FIG. 6B, in some embodiments, dummy capacitors 603 (613) may be formed as finger MOM capacitors. Dummy capacitors 603 (613) may include a first dummy electrode 640 formed by a frame piece and a second electrode 680 formed by another frame piece. Dummy capacitors 603 (613) may also include a plurality of dummy fingers 645 (685), wherein neighboring fingers 645 (685) are closely located and insulated from each other. The dummy fingers 645 of the first dummy electrode 640 are interleaved between and are parallel to respective dummy fingers 685 of the other dummy electrode 680, It is understood that although the dummy electrodes and dummy fingers are described as separate entities for illustration purposes, that the dummy fingers and dummy electrodes can be formed as a single piece. A dielectric material layer 690 is shown as provided between the dummy electrodes 640 (680) and between the dummy fingers 645 (685). As described above, dummy capacitors 603 (613) may have a similar, or even identical structure, to that of operational capacitors 602 (612, 622) but are unconnected to any of the operational circuits in the semiconductor device 100, and thus do not perform a logic function during operations of the semiconductor device 600.

Figure 6C:
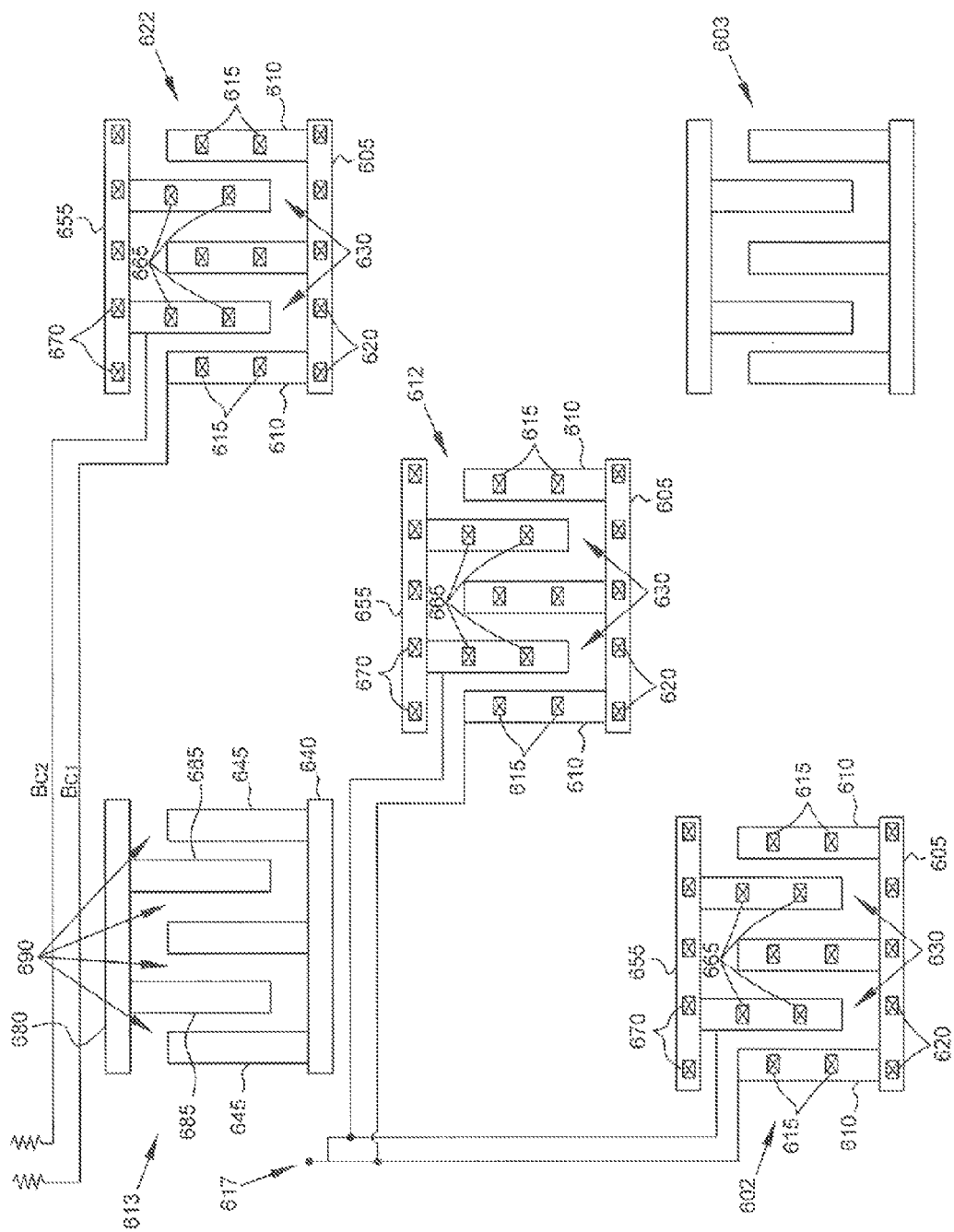
FIG. 6C illustrates an enlarged schematic plan view of a semiconductor device including a portion of another example of a capacitor array of FIG. 6A.

As illustrated in FIG. 6B, in some embodiments, dummy patterns 606 may be formed as dummy metal patterns 604 (614, 624, 634). Dummy metal patterns 604 (614, 624, 634) may be formed of a metal material including, but not limited to, copper or aluminum, or a metal alloy material such as, for example, AlCu. In an embodiment, the formation of dummy metal patterns 604 may include a damascene process, which comprises etching a pattern (trench) and filling the pattern (trench) with copper. Dummy metal patterns 604 (614, 624, 634) may not have any logic functions, and may not be electrically connected to any of the operational capacitors 602 (612, 622) or any other active circuit (not shown) in semiconductor device 600. As shown in FIG. 6B, dummy metal patterns 604 (614, 624, 634) are formed adjacent to operational capacitors 602 (612, 622). In some embodiments, dummy metal patterns 604 and operational capacitors 602 are formed in a single damascene process. With reference to FIG. 6C, an enlarged schematic plan view of a semiconductor device 600 including a portion of an example capacitor array 601 of FIG. 6A is provided. Operational capacitors 602 (612, 622) and dummy capacitors 603 (613) are formed in a similar manner to that shown and described at FIGS. 6A-6B. As illustrated in FIGS. 6A and 6C, dummy patterns 606 may be formed as dummy capacitor cells 606. Dummy capacitor cells 606 may be formed adjacent to operational capacitors 602 (612, 622).

The inventors have observed that by forming this enhanced checkerboard array design using dummy patterns (including dummy capacitors) and operational capacitors, MOM capacitor gradient effect can be further reduced, capacitance shift across the capacitor array can be further minimized, chemical-mechanical polishing (CMP) process issues such as dishing and erosion can be further reduced, and improved model accuracy can be achieved. The inventors have further determined that minimizing the metal density of the dummy patterns (including dummy capacitors) can further improve the performance and reliability of the operational capacitors in the array and the semiconductor device as a whole.

Figure 7:
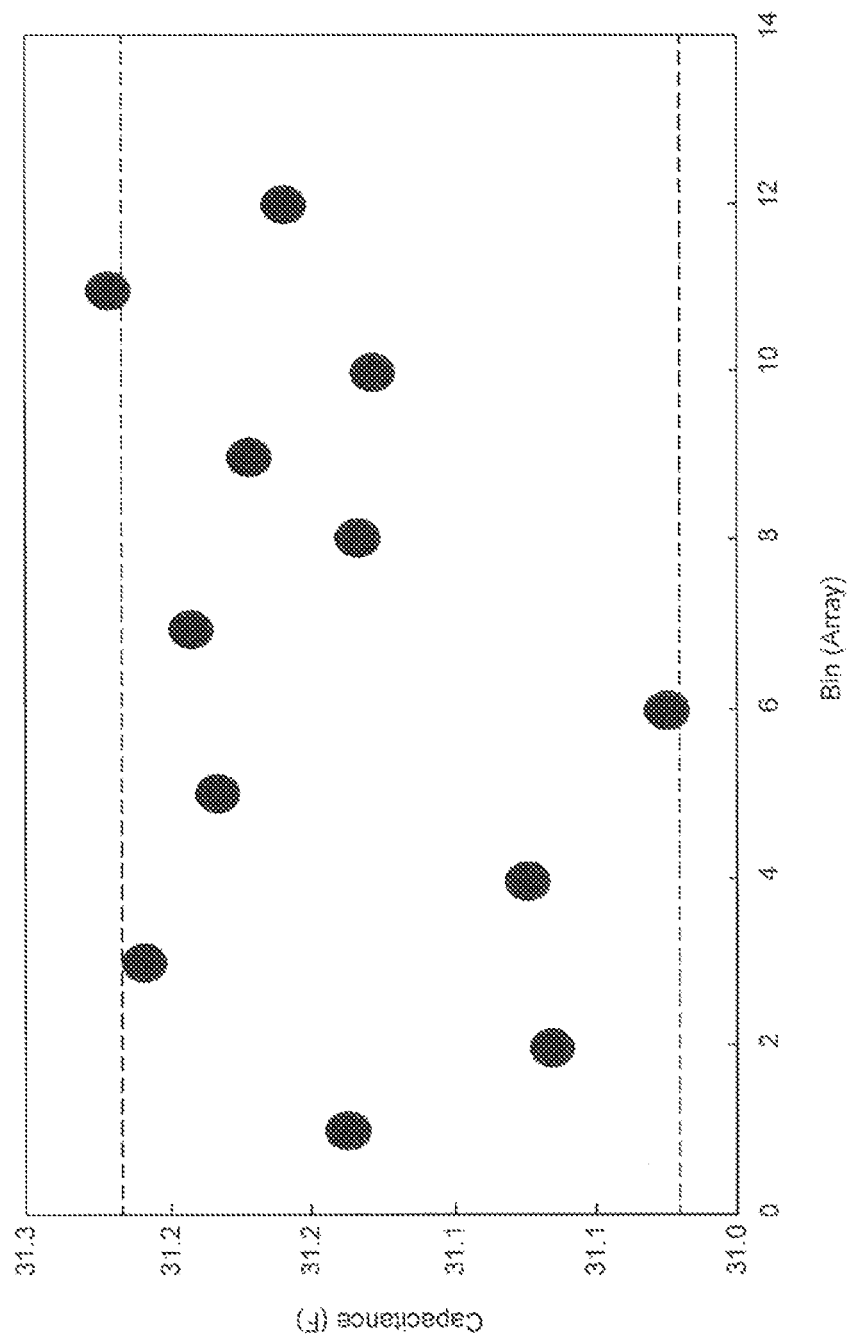
FIG. 7 is a diagram showing capacitance measured across an example of a capacitor array formed according to an embodiment of the present disclosure.

For example, FIG. 7 shows a diagram of capacitance measured using a CBCM technique from right edge to center to left edge across an example of a capacitor array formed according to an embodiment of the present disclosure. In the illustrated embodiment, a N28 MOM capacitor array was formed. The capacitor array comprised a substantially equilateral 16×16 two dimensional grid as illustrated in FIG. 6A including fifteen (15) operational capacitors 602 formed along a diagonal of the array with one hundred thirteen (113) dummy capacitors 603 and one hundred twenty-eight (128) dummy metal patterns 604 formed substantially symmetrically about the operational capacitors 602 in the capacitor array. Each side of the capacitor array was approximately 80 μm in length. With reference to FIG. 6A including the cells illustrating various operational capacitors 602 in order by location, an operational capacitor 602 was formed in the lower left edge cell of the capacitor array, a dummy capacitor 603 was formed in the upper right edge cell, and a dummy metal pattern 604 was formed in the upper left edge and lower right edge cells of the capacitor array 601. As illustrated, the median capacitance of the 15 operational capacitors 602 was approximately 31.12 femtofarads. The capacitance measured across the capacitor array between the operational capacitors 602 formed across the array was observed to fall at or within 0.2% of the median measured capacitance.

The inventors have further determined that by forming this enhanced checkerboard array design using dummy capacitors, operational capacitors and dummy patterns, shorter electrical connections may be utilized and smaller device area may be consumed. For example, the array design illustrated in FIGS. 6A-6C, permits electrically coupling adjacent operational capacitors to each other as there are significant reductions in gradient effect attained by the design and by minimizing metal density. Referring back to FIGS. 6A-6C, each one of the plurality of operational capacitors 602 may be electrically coupled to an adjacent other one of the plurality of operational capacitors 102. For example, operational capacitor 602 may be electrically coupled to an adjacent, or close in proximity, other one of the plurality of operational capacitors (e.g. 612) via buses $B_{A1}$, $B_{A2}$ and $B_{B1}$, $B_{B2}$ connecting the respective fingers 610, 660 of the interconnected operational capacitors (602, 612). The electrically coupled operational capacitors (602, 612) are further interconnected to a common node 617. In some embodiments, the buses $B_{A1}$, $B_{A2}$ ($B_{B1}$, $B_{B2}$) are metal lines formed in a metallization layer using a damascene process. Alternatively, the buses $B_{A1}$, $B_{A2}$ ($B_{B1}$, $B_{B2}$) may be formed by depositing and patterning a metal layer. Further by way of example, and with reference to FIGS. 6A-6C, operational capacitor 602 formed in a first edge of the capacitor array 601 may be electrically coupled to a second adjacent operational capacitor 612 formed, for example, in the second to left edge cell along the diagonal of the capacitor array 601 via buses $B_{A1}$, $B_{A2}$ and $B_{B1}$, $B_{B2}$. Additionally, operational capacitor 622 formed in a third to left edge cell along the diagonal of the capacitor array 601 may be electrically coupled to an adjacent, or close in proximity, operational capacitor (not shown) formed, for example, in the fourth to left edge cell of the capacitor array 601 via buses $B_{c1}$, $B_{c2}$.

Figure 8:
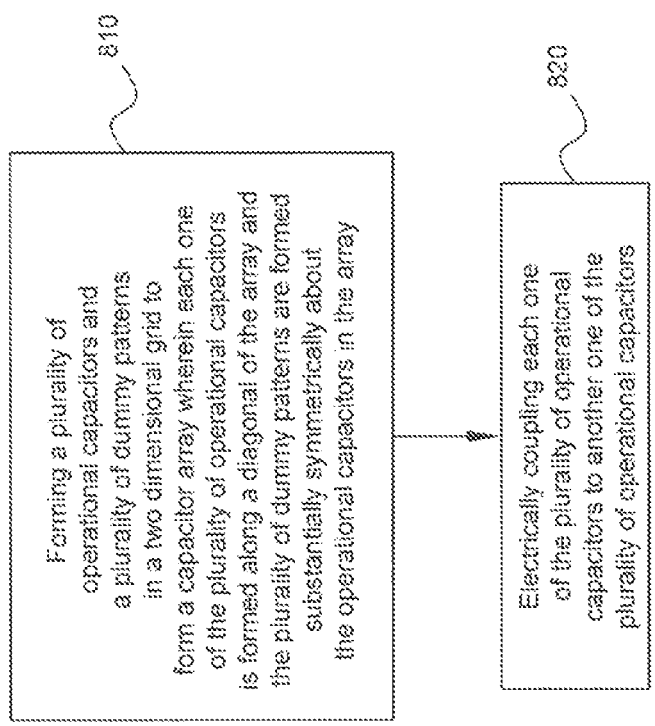
FIG. 8 is a flow chart showing a method of forming a semiconductor device according to some embodiments.

FIG. 8 shows a flow chart describing a method of forming a semiconductor device according to some embodiments. At block 810, a plurality of operational capacitors 102 (602) and a plurality of dummy patterns 606 are formed in a two dimensional grid to form a capacitor array 101 (601) wherein each one of the plurality of operational capacitors 102 (602) is formed along a diagonal of the array 101, and the plurality of dummy patterns 606 are formed substantially symmetrically about the operational capacitors in the capacitor array 101. In some embodiments, a plurality of dummy capacitors 103 (603) are formed substantially symmetrically about the operational capacitors 102 (602) in the capacitor array. In some embodiments, a plurality of dummy capacitors 103 (603) and a plurality of dummy patterns 606 are formed substantially symmetrically about the operational capacitors 102 (602) in the capacitor array. In an embodiment, a plurality of dummy capacitors 103 (603) and a plurality of dummy metal patterns 604 are formed substantially symmetrically about the operational capacitors 102 (602) in the capacitor array. In an embodiment, a plurality of dummy capacitors 103 (603) and a plurality of dummy capacitor cells are formed substantially symmetrically about the operational capacitors 102 (602) in the capacitor array. At block 840, each one of the plurality of operational capacitors 102 (602) is electrically coupled to another one of the plurality of operational capacitors 102 (602). In some embodiments, each one of the plurality of operational capacitors 102 (602) is electrically coupled to a non-adjacent one of the plurality of operational capacitors 102 (602). In other embodiments, each one of the plurality of operational capacitors 102 (602) is electrically coupled to an adjacent one of the plurality of operational capacitors 102 (602).

As shown by the various configurations and embodiments illustrated in FIGS. 1A-8, various improved semiconductor devices have been described.

One embodiment provides a semiconductor device including a capacitor array. The capacitor array includes a plurality of operational capacitors formed along a diagonal of the capacitor array. The capacitor array also includes a plurality of dummy capacitors formed substantially symmetrically about the plurality of operational capacitors in the capacitor array. A first operational capacitor is formed at a first edge of the capacitor array. Each one of the plurality of operational capacitors is electrically coupled to a non-adjacent other one of the plurality of operational capacitors.

Another embodiment provides a semiconductor device including a capacitor array. The capacitor array includes a plurality of operational capacitors formed along a diagonal of the array. The capacitor array also includes a plurality of dummy patterns formed substantially symmetrically about the operational capacitors in the capacitor array; Each one of the plurality of operational capacitors is electrically coupled to another one of the plurality of capacitors.

A further embodiment provides a method of forming a semiconductor device including forming a plurality of operational capacitors and a plurality of dummy patterns in a two dimensional grid to form a capacitor array. The step of forming includes patterning the two dimensional grid such that each one of the plurality of operational capacitors is formed along a diagonal of the array and the plurality of dummy patterns are formed substantially symmetrically about the operational capacitors in the capacitor array. Each one of the plurality of operational capacitors is electrically coupled to another one of the plurality of operational capacitors.

While various embodiments have been described, it is to be understood that the embodiments described are illustrative only and that the scope of the subject matter is to be accorded a full range of equivalents, many variations and modifications naturally occurring to those of skill in the art from a perusal hereof.

Furthermore, the above examples are illustrative only and are not intended to limit the scope of the disclosure as defined by the appended claims. Various modifications and variations can be made in the methods of the present subject matter without departing from the spirit and scope of the disclosure. Thus, it is intended that the claims cover the variations and modifications that may be made by those of ordinary skill in the art.

What we claim is:

1. A semiconductor device, comprising:
   a capacitor array formed in a plurality of cells of a two-dimensional grid, comprising:
      a plurality of operational capacitors formed in a first subset of the plurality of cells along a diagonal of the array wherein a first operational capacitor is formed in a cell at a first edge of the capacitor array and at a first edge of the diagonal of the capacitor array; and
      a plurality of dummy capacitors formed about the plurality of operational capacitors in the capacitor array in a second subset of the plurality of cells to achieve symmetry in the grid about the diagonal, wherein the plurality of dummy capacitors comprise a dummy capacitor formed in a cell at a second edge of the capacitor array and at a second edge of the diagonal of the capacitor array; and
   wherein each one of the plurality of operational capacitors is electrically coupled to a non-adjacent other one of the plurality of operational capacitors.

2. The semiconductor device of claim 1, wherein each one of the plurality of operational capacitors is a metal-oxide-metal (MOM) capacitor.

3. The semiconductor device of claim 2, wherein one or more of the plurality of operational capacitors is a finger MOM capacitor.

4. The semiconductor device of claim 1, wherein the sides of the two dimensional grid are substantially equilateral.

5. The semiconductor device of claim 1, wherein at least two of the plurality of dummy capacitors are formed adjacent to each one of the plurality of operational capacitors.

6. A semiconductor device, comprising:
   a capacitor array formed in a plurality of cells of a two-dimensional grid, comprising:
      a plurality of operational capacitors formed in diagonally adjacent cells of the plurality of cells along a diagonal of the array wherein an operational capacitor is formed in a cell at a first edge of the capacitor array and at a first edge of the diagonal of the capacitor array; and
      a plurality of dummy patterns formed symmetrically about the plurality of operational capacitors in the capacitor array in a subset of the plurality of cells wherein the plurality of dummy patterns comprise a dummy capacitor formed in a cell at a second edge of the capacitor array and at a second edge of the diagonal of the capacitor array;
   wherein each one of the plurality of operational capacitors is electrically coupled to another one of the plurality of operational capacitors.

7. The semiconductor device of claim 6, wherein each one of the plurality of operational capacitors is a metal-oxide-metal (MOM) capacitor.

8. The semiconductor device of claim 6, wherein one or more of the plurality of operational capacitors is a finger MOM capacitor.

9. The semiconductor device of claim 6, wherein the plurality of dummy patterns comprise a second dummy capacitor formed in a respective cell at a third edge of the capacitor array.

10. The semiconductor device of claim 9, wherein the plurality of dummy patterns further comprise a third dummy capacitor formed in a respective cell at a fourth edge of the capacitor array.

11. The semiconductor device of claim 3, wherein the one or more of the plurality of operational capacitors further comprises a plurality of layers interconnected in parallel with a plurality of vias formed in a third dimension between electrode layers and finger layers of the one or more of the plurality of operational capacitors.

12. The semiconductor device of claim 1, wherein the capacitance measured between the operational capacitors of the capacitor array is between 0 and 1% of a median capacitance of the operational capacitors of the capacitor array.

13. The semiconductor device of claim 12, wherein the median capacitance of the operational capacitors of the capacitor array is between approximately ten and forty femtofarads.

14. The semiconductor device of claim 6, wherein the capacitance measured between the operational capacitors of the capacitor array is between 0 and 1% of a median capacitance of the operational capacitors of the capacitor array.

15. The semiconductor device of claim 8, wherein the one or more of the plurality of operational capacitors further comprises a plurality of layers interconnected in parallel with a plurality of vias formed in a third dimension between electrode layers and finger layers of the one or more of the plurality of operational capacitors.

16. The semiconductor device of claim 6, wherein each one of the plurality of operational capacitors is electrically coupled to a non-adjacent other one of the plurality of operational capacitors.

17. A semiconductor device, comprising:
   a capacitor array formed in a plurality of cells of a two-dimensional grid, comprising:
      a plurality of operational capacitors formed in a first subset of the plurality of cells along a diagonal of the array; and
      a plurality of dummy patterns formed symmetrically about the plurality of operational capacitors in the capacitor array in a second subset of the plurality of cells wherein the plurality of dummy patterns comprise a dummy capacitor formed in a cell at a second edge of the capacitor array and at a second edge of the diagonal of the capacitor array;
   wherein each one of the plurality of operational capacitors is electrically coupled to another one of the plurality of operational capacitors;
   and wherein a first operational capacitor is formed in a cell at a first edge of the capacitor array and at a first edge of the diagonal of the capacitor array.

18. The semiconductor device of claim 17, wherein each one of the plurality of operational capacitors is electrically coupled to a non-adjacent other one of the plurality of operational capacitors.

19. The semiconductor device of claim 17, wherein the plurality of dummy patterns further comprise at least two dummy capacitors formed adjacent to each one of the plurality of operational capacitors.

20. The semiconductor device of claim 17, wherein the dummy capacitor formed in the cell at the second edge of the capacitor array is the only dummy capacitor formed adjacent to any one of the plurality of operational capacitors.

* * * * *